United States Patent
Ryu et al.

(10) Patent No.: US 7,963,737 B2
(45) Date of Patent: Jun. 21, 2011

(54) APPARATUS AND METHOD FOR TRANSFERRING SUBSTRATE

(75) Inventors: Jae-Ryung Ryu, Chungcheongnam-do (KR); Hak-Hyun Kim, Chungcheongnam-do (KR); Tae-Kwon Lim, Chungcheongnam-do (KR)

(73) Assignee: Semes Co. Ltd., Chungcheongnam-do (KR)

( * ) Notice: Subject to any disclaimer, the term of this patent is extended or adjusted under 35 U.S.C. 154(b) by 833 days.

(21) Appl. No.: 11/880,061

(22) Filed: Jul. 19, 2007

(65) Prior Publication Data

US 2008/0019808 A1   Jan. 24, 2008

(30) Foreign Application Priority Data

Jul. 24, 2006   (KR) .................. 10-2006-0069372
Jul. 24, 2006   (KR) .................. 10-2006-0069373

(51) Int. Cl.
   *B66C 1/02*   (2006.01)
(52) U.S. Cl. ...................... 414/411; 294/64.1
(58) Field of Classification Search .............. 414/411, 414/744.5, 935; 901/21; 74/490.5; 294/64.1
   See application file for complete search history.

(56) References Cited

U.S. PATENT DOCUMENTS

| | | | |
|---|---|---|---|
| 5,207,114 A * | 5/1993 | Salisbury et al. | 74/479.01 |
| 6,116,848 A * | 9/2000 | Thomas et al. | 414/754 |
| 6,216,883 B1 * | 4/2001 | Kobayashi et al. | 211/41.18 |
| 6,752,442 B2 * | 6/2004 | McNurlin et al. | 294/106 |
| 7,341,295 B1 * | 3/2008 | Veatch et al. | 294/106 |
| 7,669,903 B2 * | 3/2010 | Bonora et al. | 294/64.1 |
| 2002/0071756 A1 * | 6/2002 | Gonzalez | 414/941 |
| 2007/0018469 A1 * | 1/2007 | Gershenzon et al. | 294/103.1 |

FOREIGN PATENT DOCUMENTS

| | | |
|---|---|---|
| KR | 10-2004-0098329 A | 11/2004 |
| KR | 10-2005-0068472 A | 7/2005 |

* cited by examiner

*Primary Examiner* — Charles A Fox
(74) *Attorney, Agent, or Firm* — Jenkins, Wilson, Taylor & Hunt P.A.

(57) ABSTRACT

Provided are an apparatus and method for transferring substrates. The substrate transferring apparatus is provided with a plurality of blades capable of withdrawing wafers from inside a container. Withdrawing members are elevated within coupling holes formed in the blades, and wafers are withdrawn by elevating and protruding the withdrawing members from the coupling holes of the blades. The withdrawing members are formed to be hollow, and are selectively elevated from the blades by supplying gas therein. Alternately, the withdrawing members are rotatably connected to the blades, and wafers are withdrawn when the withdrawing members are pivoted to protrude from the blades. Here, a withdrawing member includes a rotating shaft, and is pivoted when tension is applied to a wire wound around the rotating shaft. The wound wire is rotated by a driver that is selectively operated by a controller.

8 Claims, 13 Drawing Sheets

APPARATUS AND METHOD FOR TRANSFERRING SUBSTRATE

CROSS-REFERENCE TO RELATED APPLICATIONS

This U.S. non-provisional patent application claims priority under 35 U.S.C. §119 of Korean Patent Application Nos. 2006-69372, and 2006-69373, filed on Jul. 24, 2006, the entire contents of which are hereby incorporated by reference.

BACKGROUND OF THE INVENTION

The present invention disclosed herein relates to an apparatus and method for transferring a substrate, and more particularly, to an apparatus and method for transferring a substrate that withdraws a substrate from a container.

Recently, due to an increase in the diameter of semiconductor wafers from 200 mm to 300 mm, a sealed wafer container called a front open unified pod (FOUP) is being employed to protect wafers from impurities and chemical contaminants in the air. Also, because a semiconductor chip is manufactured in a fully automated system, an equipment front end module (EFEM), that acts as an interface between a wafer container and a load lock chamber within processing equipment, is installed on the processing equipment.

A transfer unit for transferring wafers is installed within the above-described EFEM. The transfer unit includes a plurality of blades that withdraws a plurality of wafers loaded into a wafer container. The blades transfer the withdrawn wafers to the load lock chamber in the processing equipment.

However, conventional transfer units are only capable of unloading the plurality of wafers within the wafer container at the same time. Therefore, an alternate device capable of selectively unloading wafers is required.

SUMMARY OF THE INVENTION

The present invention provides a substrate transferring apparatus and method capable of selectively unloading substrates from within containers.

Embodiments of the present invention provide apparatuses for withdrawing substrates from within a container and transferring the substrates, the apparatus including: a plurality of blades on which the substrates are respectively placed during transferring; a plurality of withdrawing members installed at respective ends of the blades to protrude upward from the blades when withdrawing the substrates from the container; and a driving unit for selectively protruding the withdrawing members from the blades.

In some embodiments, the withdrawing member may have a hollow shape defining a cavity, and may be installed to rise and descend in a coupling hole formed in the end of the blade. The withdrawing member may be sealed at a top portion thereof.

In other embodiments, the driving unit may include: supply lines respectively formed in the blades, the supply line connected to the cavity of the withdrawing member, for supplying gas into the cavity; valves for opening and closing the supply lines, respectively; and a controller for selectively controlling the valves.

In still other embodiments, the withdrawing member may include a stopper extending outward from an outer surface thereof, for preventing the withdrawing member from disengaging from the coupling hole.

In even other embodiments, the withdrawing member may comprise a rotating bar, one end of the rotating bar being connected to the blade and the other end being capable of rotating to protrude upward from the blade. The withdrawing member may further include a rotating shaft connected perpendicularly to one end of the rotating bar, the rotating shaft rotating to cause the rotating bar to protrude from the blade, and the driving unit may include: a wire, one end of the wire being wound around the rotating shaft; and a driver for rotating and winding the other end of the wire.

In yet other embodiments, the apparatus may further include an elastic member connected to the rotating shaft for providing elastic force against the rotating shaft to position the rotating bar in a non-protrusive disposition with respect to the blade.

In still other embodiments of the present invention, methods for withdrawing substrates from inside a container and transferring the substrates, the method including: moving a plurality of blades into the container, the blades being provided respectively with a withdrawing member for withdrawing the substrates from inside the container; withdrawing substrates from the container through selectively operating withdrawing members corresponding to the substrates to be withdrawn; and transferring the withdrawn substrates to a predetermined location.

In even other embodiments of the present invention, the selective operating of the withdrawing members may include selectively protruding the withdrawing members from the blades. The selective protruding of the withdrawing members may include selectively supplying gas into hollow portions of the withdrawing members.

In yet other embodiments of the present invention, the withdrawing members may be respectively and rotatably connected to the blades, and the operating of the withdrawing members may include rotating the withdrawing members to protrude from the blades.

In further embodiments of the present invention, the rotating the withdrawing members to protrude from the blades may include selectively applying tension to wires wound around rotating shafts connected to the withdrawing members.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to FIGS. 1 through 10*b*. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Thus, the dimensions of elements in the figures may be exaggerated for clarity of illustration.

While the substrate in the description below is exemplified by a wafer (W), the present invention is not limited thereto.

Figure 1:
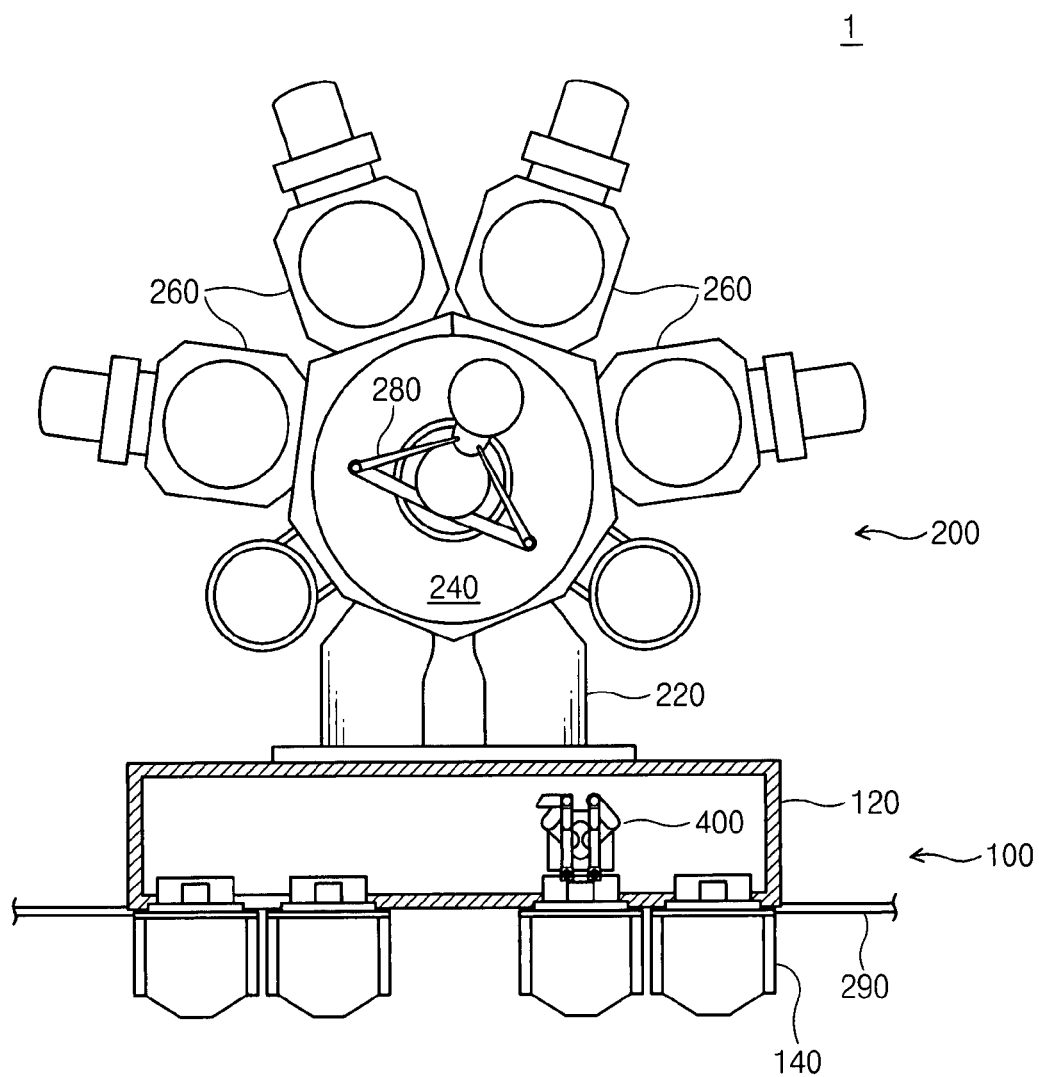
FIG. 1 is a schematic diagram of semiconductor equipment.
Figure 2:
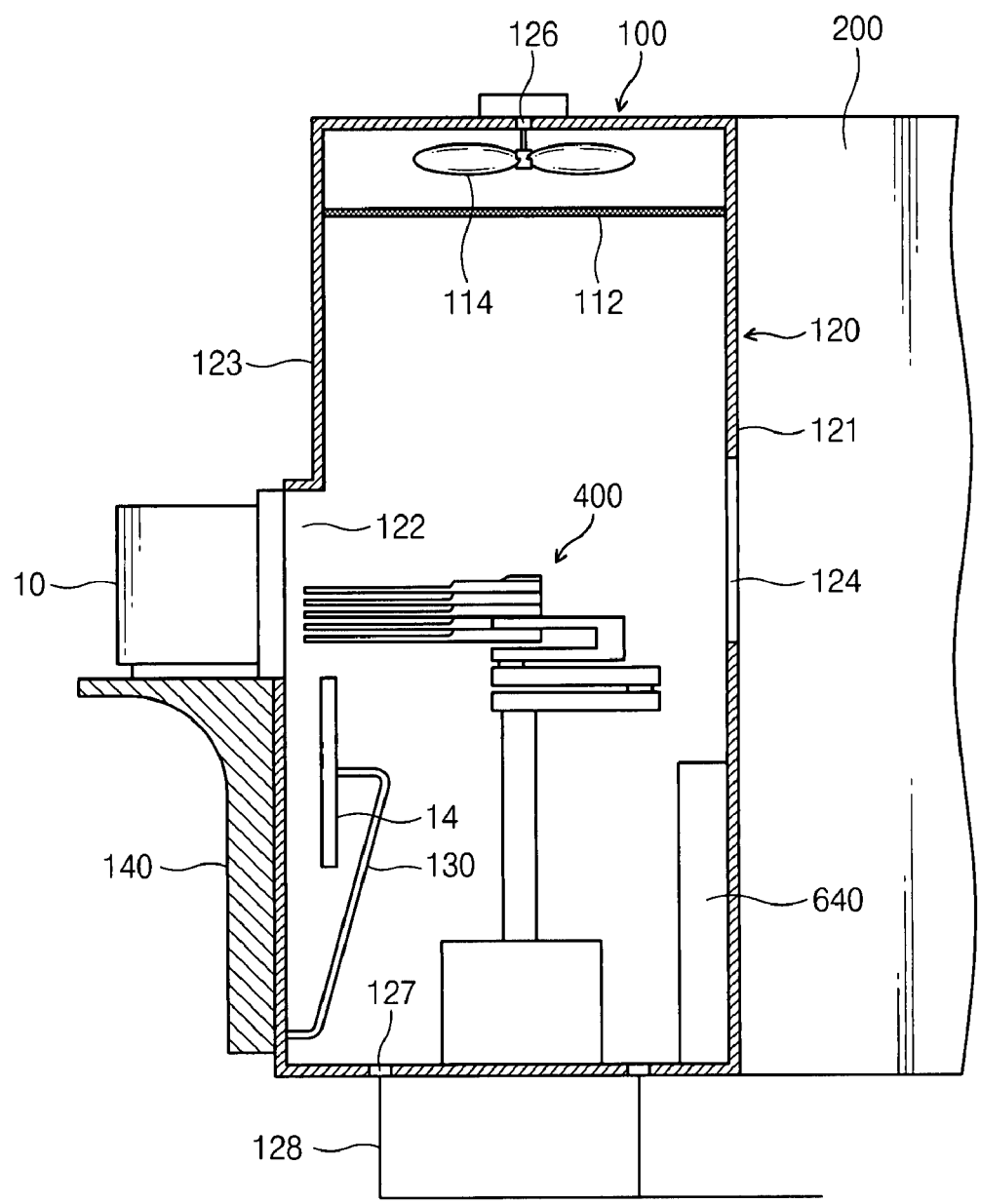
FIG. 2 is a diagram showing the inside of the EFEM in FIG. 1.

FIG. 1 is a schematic diagram of semiconductor equipment 1, and FIG. 2 is a diagram showing the inside of the EFEM 100 in FIG. 1.

As shown in FIG. 1, semiconductor equipment 1 includes processing equipment 200, an EFEM 100, and an interface wall 290. The processing equipment 200 includes at least one load lock chamber 220, a transfer chamber 240, and a plurality of process chambers 260. For example, the process chambers 260 may include chambers for chemical vapor deposition equipment and dry etch equipment, and a thermal furnace. At the hub of the process chambers 260 is the transfer chamber 240 with a transfer robot 280 installed thereon. The transfer robot 280 transfers wafers between the load lock chamber 220 and the process chambers 260. This processing equipment 200 retains an extremely high level of purity compared to the outside environment, and a partitioning wall divides the processing equipment 200 from the outer environment. An EFEM 100, capable of acting as an interface between a wafer container that holds and transfers wafers and the processing equipment 200, is installed to one side of the processing equipment 200.

Referring to FIG. 2, the EFEM 100 includes a frame 120, a load station 140, and a transfer unit 400. The frame 120 has a hexahedral shape, and includes an entrance 124 formed in a rear face 121 that is the side adjacent to the processing equipment 200, through which wafers are transferred between the frame 120 and the processing equipment 200. In order to maintain the interior of the frame 120 at a certain level of purity, an air inlet 126 (through which air from the outside flows in) may be formed in the top surface of the frame 120, and an exhaust port 127 (to which an exhaust line 128 for discharging air to the outside is connected) may be formed at the bottom surface of the frame 120. The load station 140, on which a wafer container 10 is placed, is installed on one side of a front face 123 that is opposite to the rear face 121 of the EFEM 100. The load station 140 may be installed singularly or in plurality. The wafer container 100 used may be an FOUP that is a sealed wafer carrier for protecting wafers from impurities and chemical contaminants in the air during transferal. The container 10 may be loaded on or unloaded from the load station 140 by a carrier transfer system (not shown), such as an overhead transfer (OHT), overhead conveyor (OHC), and automatic guided vehicle (AGV or RGV). The frame 120 has an opener 130 for opening and closing a door 14 of the container 10 placed on the load station 140. When the door 14 of the container 10 is opened by the opener 130, an opening 122 is formed the front surface 123 of the frame 120 to provide a transfer passage for wafers.

Figure 3:
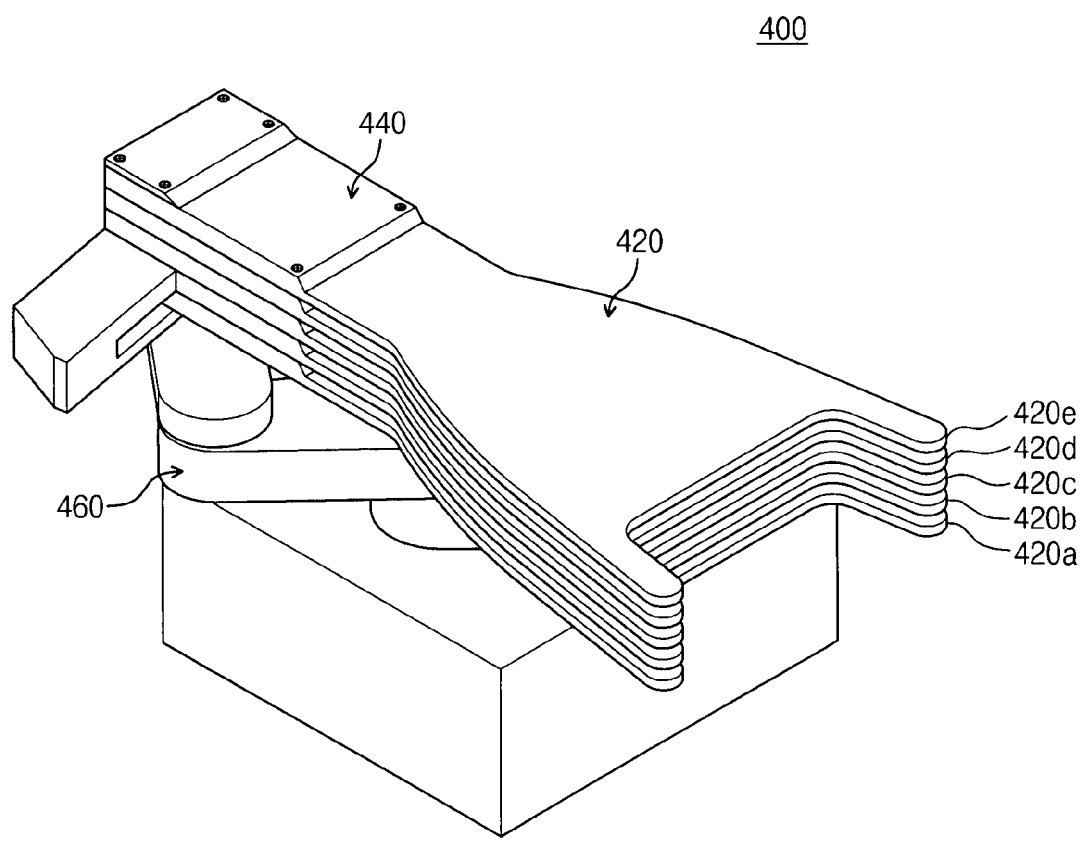
FIG. 3 is a perspective view of a substrate transfer unit according to the present invention.

A transfer unit 400, for transferring wafers from the container 10 to the load lock chamber 220 of the process equipment 200, is disposed within the EFEM 100. FIG. 3 is a perspective view of a transfer unit 400 according to the present invention.

Referring to FIG. 3, the transfer unit 400 includes a blade 420, a fixing body 440, and a fixing body moving part 460.

The blade 420, as a portion that holds wafers, is formed of first through fifth blades 420*a*, 420*b*, 420*c*, 420*d*, and 420*e*. The first through fifth blades 420*a*, 420*b*, 420*c*, 420*d*, and 420*e* are coupled to an end of the fixing body 440 so they are disposed on top of one another. Gaps between the first through fifth blades 420*a*, 420*b*, 420*c*, 420*d*, and 420*e* are formed the same as gaps between slots formed inside the container 10. A detailed description of the blades 420 will be provided below.

The moving part 460, for rotating/linearly moving the fixing body 440, is coupled below the fixing body 440. The blades 420 fixed by the moving part 460 to the fixing body 440 move into the container 10 to withdraw wafers from the container 10 and transfer them to the load lock chamber 220. In the present embodiment, 5 blades 420 are provided. However, the number of blades 420 is not limited to the number in the present embodiment, and may be varied.

A sensor (not shown) may be installed on the upper portion of the fixing body 440. The sensor is for checking the state inside the container 10—for example, determining the number of slots, whether wafers are placed in the slots, etc.

Figure 4:
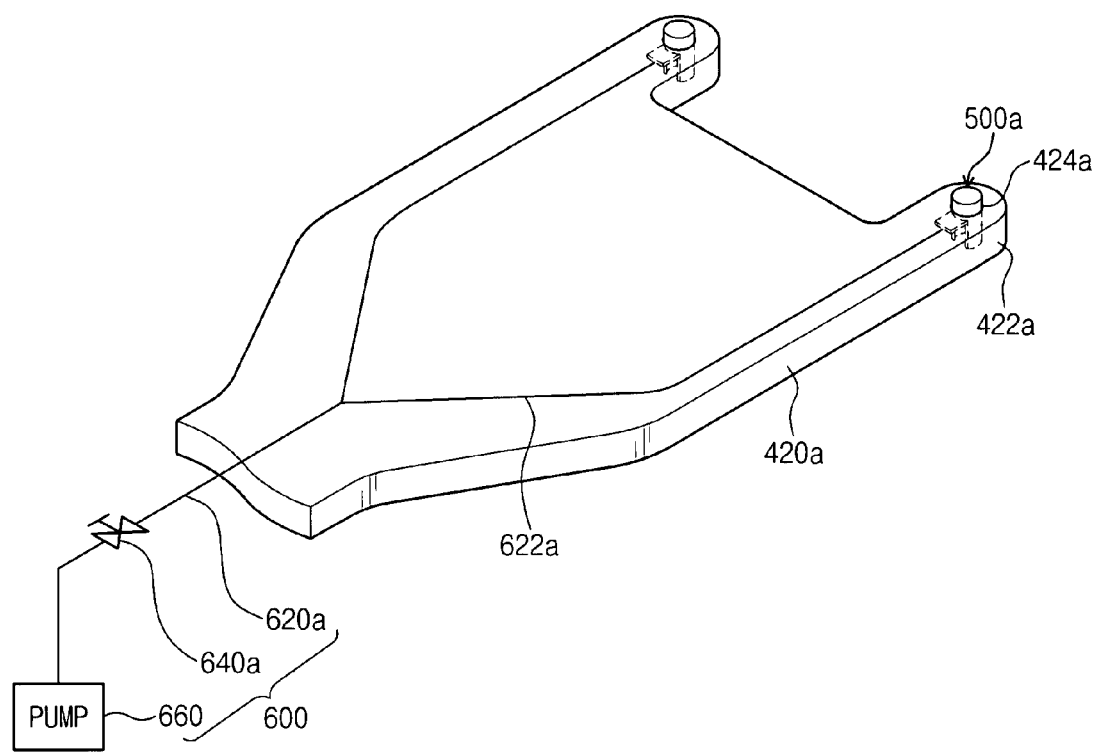
FIG. 4 is a perspective view of an inner component of a substrate transfer unit according to the first embodiment of the present invention.

FIG. 4 is a perspective view showing the inside of a first blade 420*a* according to the first embodiment of the present invention. Because the second through fifth blades 420*b*, 420*c*, 420*d*, and 420*e* have the same structure and perform the same function, a description thereof will be omitted herein. Also, as shown in FIG. 4, the first blade 420*a* is formed symmetrically about a centerline thereof, so that repetitive descriptions of symmetrical portions will not be given.

The first blade 420*a* has a form that gradually widens from the fixing body 440 to the end of the first blade 420*a*, and forms two first protrusions 422*a* at the end thereof. A first coupling hole 424*a* is formed in the upper surface of the first protrusion 422*a*. The first coupling hole 424*a* is formed recessed into the upper surface of the first protrusion 422*a*. A first withdrawing member 500*a* (to be described) is installed in the first coupling hole 424*a*.

Figure 5:
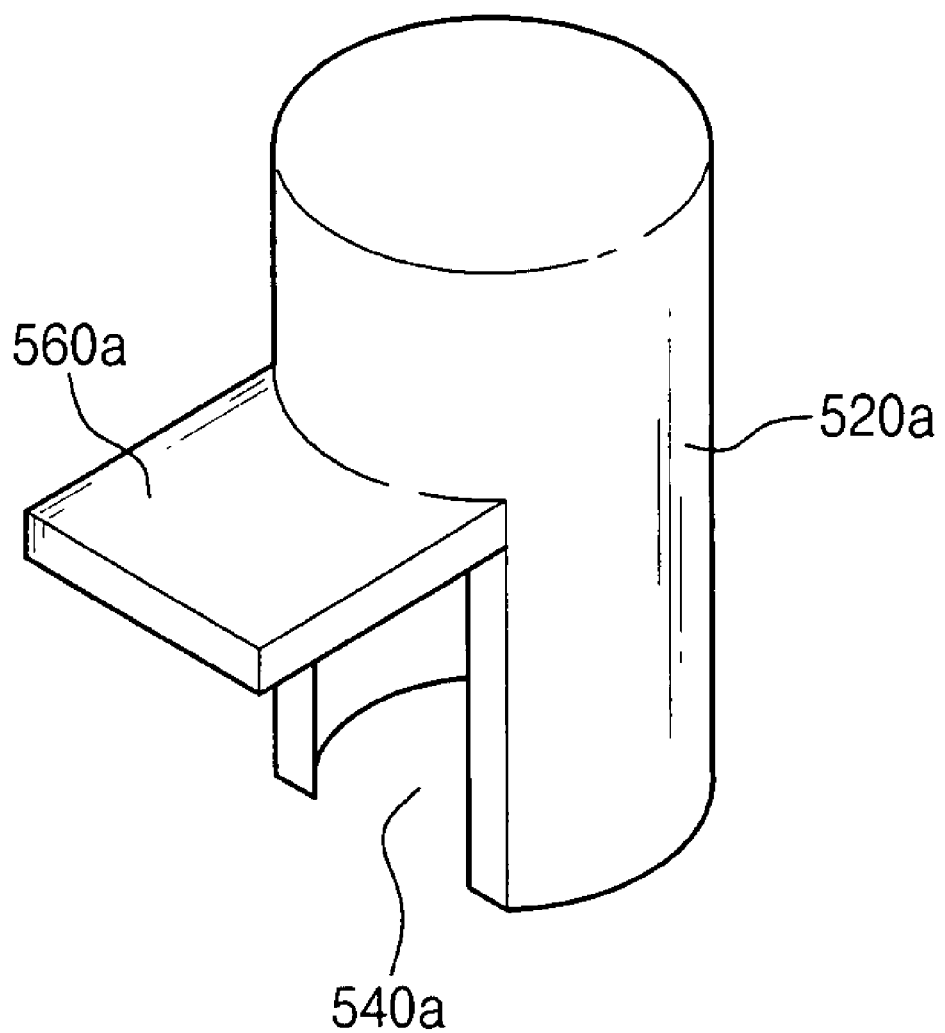
FIG. 5 is an enlarged perspective view of a withdrawing member in FIG. 4.

FIG. 5 is an enlarged perspective view of a first withdrawing member 500*a* in FIG. 4.

As described, the first withdrawing member 500*a* is installed in the first coupling hole 424*a*. The first withdrawing member 500*a* includes a first body 520*a*, a first inlet hole 540*a*, and a first stopper 560*a*.

The first body 520*a* has a hollow cylindrical shape. The first body 520*a* has a height corresponding to the first coupling hole 424*a*, such that it does not protrude from the first blade 420*a* when the first body 520*a* is lowered.

The first body 520*a* defines a cavity within, so that when gas is supplied through a first supply line 620*a* (to be described) into the first body 520*a*, the supplied gas raises the first body 520 by applying pressure therein.

The first inlet hole 540*a* is formed in the outer surface of the first body 520*a*. The first inlet hole 540*a* is a passage that allows gas supplied by the first supply line 620*a* to enter the inside of the first body 520*a*.

The first stopper 560a extends outwardly from the outer surface of the first body 520a. The first stopper 560a prevents the first body 520a from being excessively raised by the gas to disengage from the first coupling hole 424a.

The first withdrawing member 500a is driven by an elevating unit 600. The elevating unit 600 includes a first supply line 620a, a first valve 640a, and a pump 660.

The first supply line 620a is provided within the first blade 420a, and two first branch lines 622a branch from an end of the first supply line 620a. The first branch lines 622a communicate with the inside of the first body 520a to supply gas into the first body 520a.

The first valve 640a is installed on the first supply line 620a to open and close the first supply line 620a. The other end of the first supply line 620a has the pump 660 installed thereto, where the pump 660 forcibly supplies gas to the first supply line 620a. Here, the supplied gas may be an inert gas that does not react with wafers.

Figure 6A:
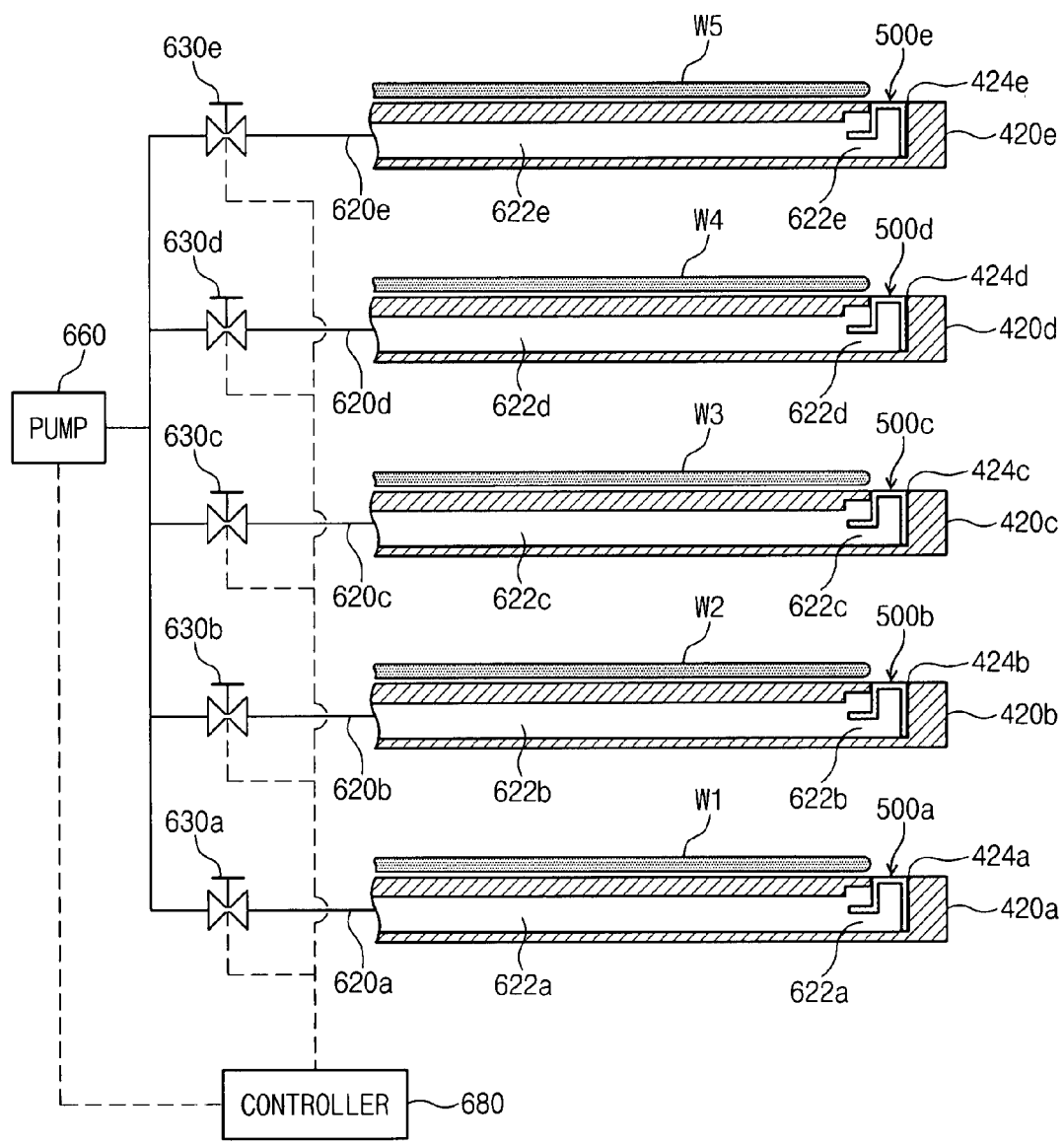
FIGS. 6a and 6b are diagrams showing the operation of the substrate transfer unit in FIG. 4.
Figure 6B:
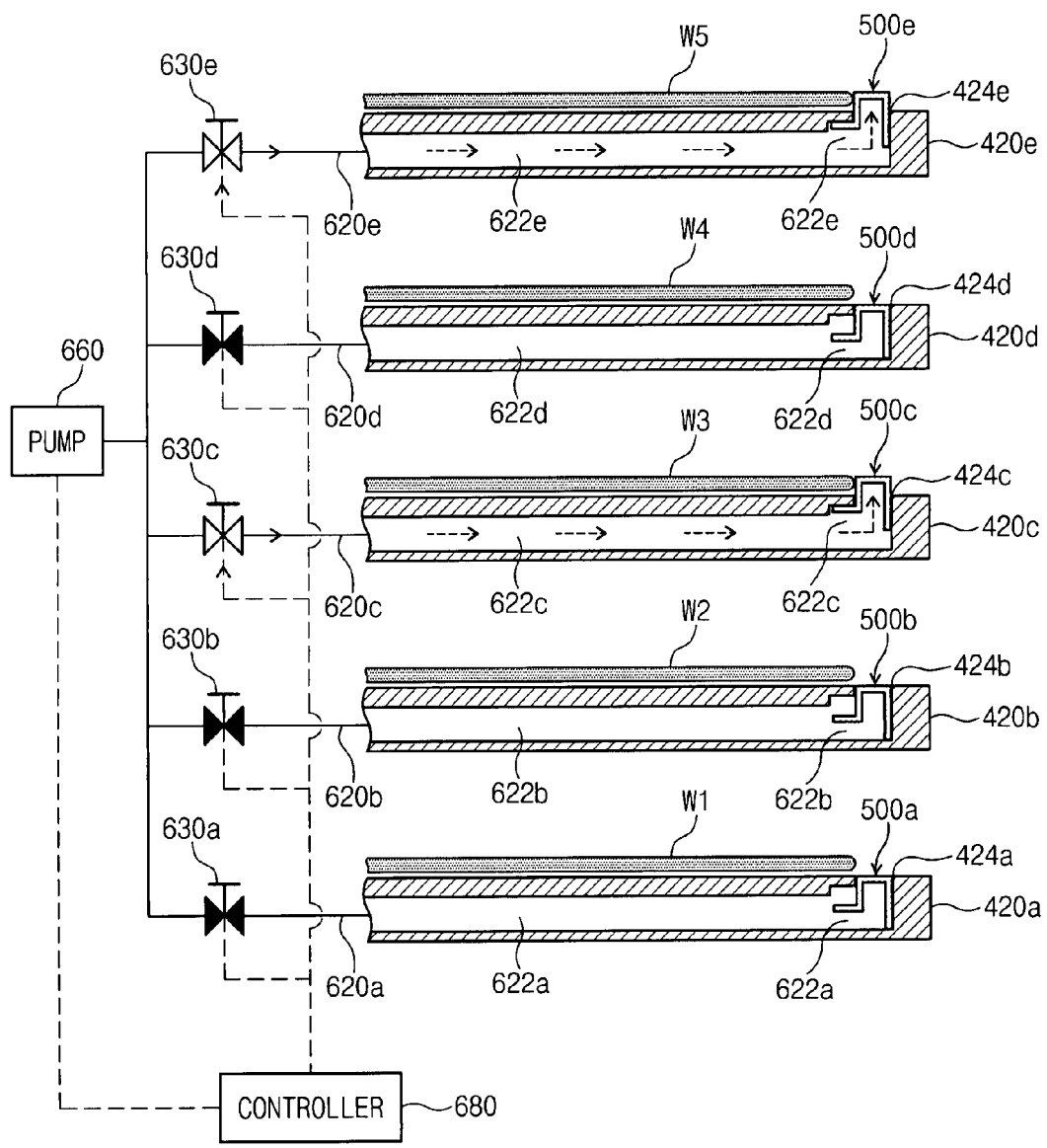
Figure 7:
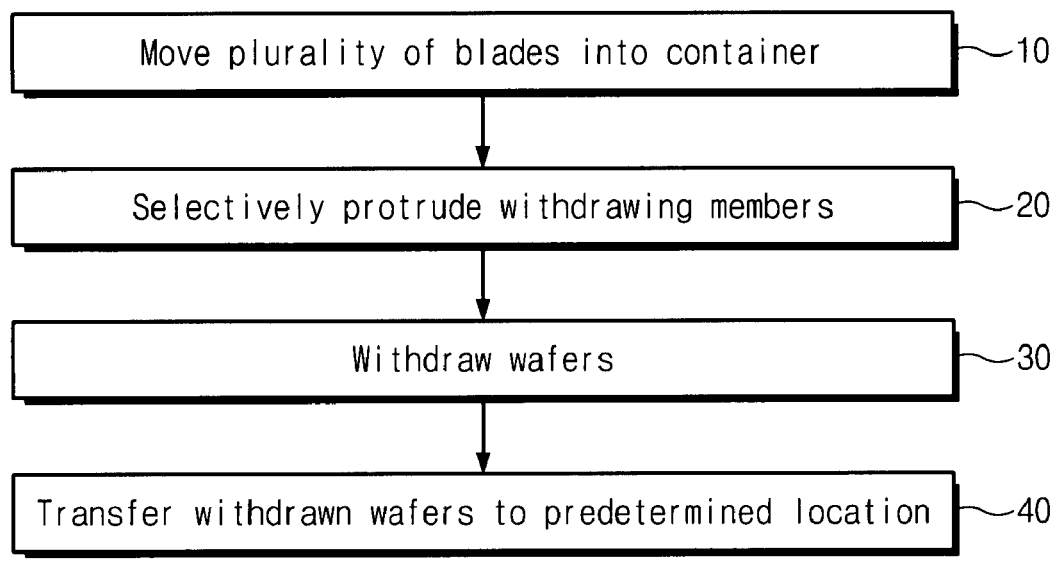
FIG. 7 is a flowchart of a method for transferring a substrate according to the present invention.

FIGS. 6a and 6b are diagrams showing the operation of the substrate transfer unit 400 in FIG. 4, and FIG. 7 is a flowchart of a method for transferring a wafer according to the present invention.

Referring to FIG. 6a, first through fifth withdrawing members 500a, 500b, 500c, 500d, and 500e are respectively provided in first through fifth coupling holes 424a, 424b, 424c, 424d, and 424e; and first through fifth supply lines 620a, 620b, 620c, 620d, and 620e, and first through fifth branch lines 622a, 622b, 622c, 622d, and 622e, are connected to the first through fifth withdrawing members 500a, 500b, 500c, 500d, and 500e. First through fifth valves 640a, 640b, 640c, 640d, and 640e are installed on the first through fifth supply lines 620a, 620b, 620c, 620d, and 620e; and the first through fifth supply lines 620a, 620b, 620c, 620d, and 620e are connected to a pump 660.

The elevating unit 600 further includes a controller 680. The controller 680 controls the opening and closing of the first through fifth valves 640a, 640b, 640c, 640d, and 640e, and the operation of the pump 660.

Below, a method of selectively transferring wafers will be described with reference to FIGS. 6a through 7.

First, the first through fifth blades 420a, 420b, 420c, 420d, and 420e are transferred into the container 10 in operation S10. The first through fifth blades 420a, 420b, 420c, 420d, and 420e are respectively inserted into slots formed within the container 10. Here, first through fifth wafers W1, W2, W3, W4, and W5 are supported respectively in the slots, and the first through fifth wafers W1, W2, W3, W4, and W5 are respectively positioned on the first through fifth blades 420a, 420b, 420c, 420d, and 420e.

Next, withdrawing members beneath wafers from the first through fifth wafers W1, W2, W3, W4, and W5 to be extracted are selectively activated in operation S20. Elevating of the first through fifth withdrawing members 500a, 500b, 500c, 500d, and 500e is controlled by the controller 660.

For example, to withdraw the third and fifth wafers W3 and W5, the controller 1660 opens the third and fifth valves 620c and 620e. When the third and fifth valves 620c and 620e are opened, gas flows through the third and fifth supply lines 620c and 620e, as shown in FIG. 6b, so that the gas supplied through the third and fifth supply lines 620c and 620e passes through the third and fifth branch lines 622c and 622e and into the third and fifth bodies 520e and 520e.

Thus, the third and fifth bodies 520c and 520e protrude upward from the third and fifth blades 420c and 420e.

When the third and fifth bodies 520c and 520e protrude from the third and fifth blades 420c and 420e, the third and fifth wafers W3 and W5 are withdrawn from the container 10 when the third and fifth blades 420c and 420e are withdrawn in operation S30. Next, the extracted wafers are transferred in operation S40 to a predetermined location, for example, to a load lock chamber 220 within processing equipment 200.

As described above, a plurality of wafers loaded in a container may selectively be transferred to a load lock chamber 220 within processing equipment 200.

Figure 8:
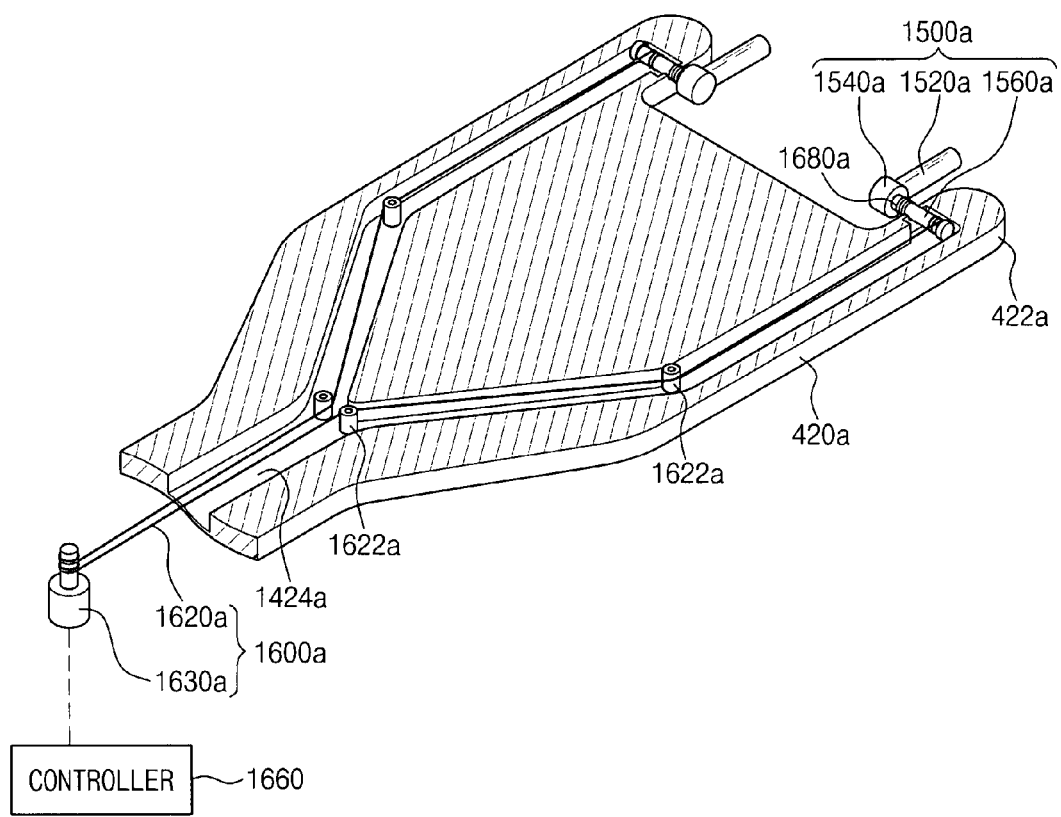
FIG. 8 is a perspective view showing the inside of a substrate transfer unit according to the second embodiment of the present invention.

FIG. 8 is a perspective view showing the inside of a first blade 420a according to the second embodiment of the present invention.

The first blade 420a has a shape that gradually widens from a fixing body 440, and has two first protrusions 422a formed at the end thereof. The first protrusion 422a has a first withdrawing member 1500a (to be described) installed thereon.

A Y-shaped first slot 1424a is formed in the first blade 420a. The first slot 1424a has a first wire 1620a and two first rollers 1622a (to be described) installed therein.

As described above, the first protrusion 422a has the first withdrawing member 1500a installed thereon. The first withdrawing member 1500a includes a first rotating bar 1520a, a first body 1540a, and a first rotating shaft 1560a.

The first rotating bar 1520a and the first rotating shaft 1560a extend perpendicularly from one another from the first body 1540a. The first rotating shaft 1560a is rotatably connected at the side of the first protrusion 422a, and the first rotating bar 1520a is protruded upward from the first blade 420a through the pivoting of the first rotating shaft 1560a.

The first withdrawing member 1500a is driven by a driving unit 1600. The driving unit 1600 includes a first wire 1620a, a first driver 1630a, and a controller 1660.

The first wire 1620a is wound around the above-described first rotating shaft 1560a, and the tension of the first wire 1620a provides rotating force to the first rotating shaft 1560a. The other end of the first wire 1620a is wound around the first driver 1630a, and the first driver 1630a rotates to either wind or unwind the first wire 1620a, whereupon the tension is imparted to the first wire 1620a.

Two first rollers 1622a are provided on the upper surface of the first slot 1424a. The two first rollers 1622a contact the first wire 1620a and are capable of rotating, so that when the first wire 1620a is moved by means of the first driver 1630a, the first rollers 1622a guide the moving path of the first wire 1620a.

The controller 1660 is connected to the first driver 1630a to drive the first driver 1630a.

The first withdrawing member 1500a further includes a first elastic member 1680a. The first elastic member 1680a is provided on the first rotating shaft 1560a, and provides elastic force in a pivoting direction of the first rotating shaft 1560a. The first elastic member 1680a will be described below in terms of its function.

Figure 9A:
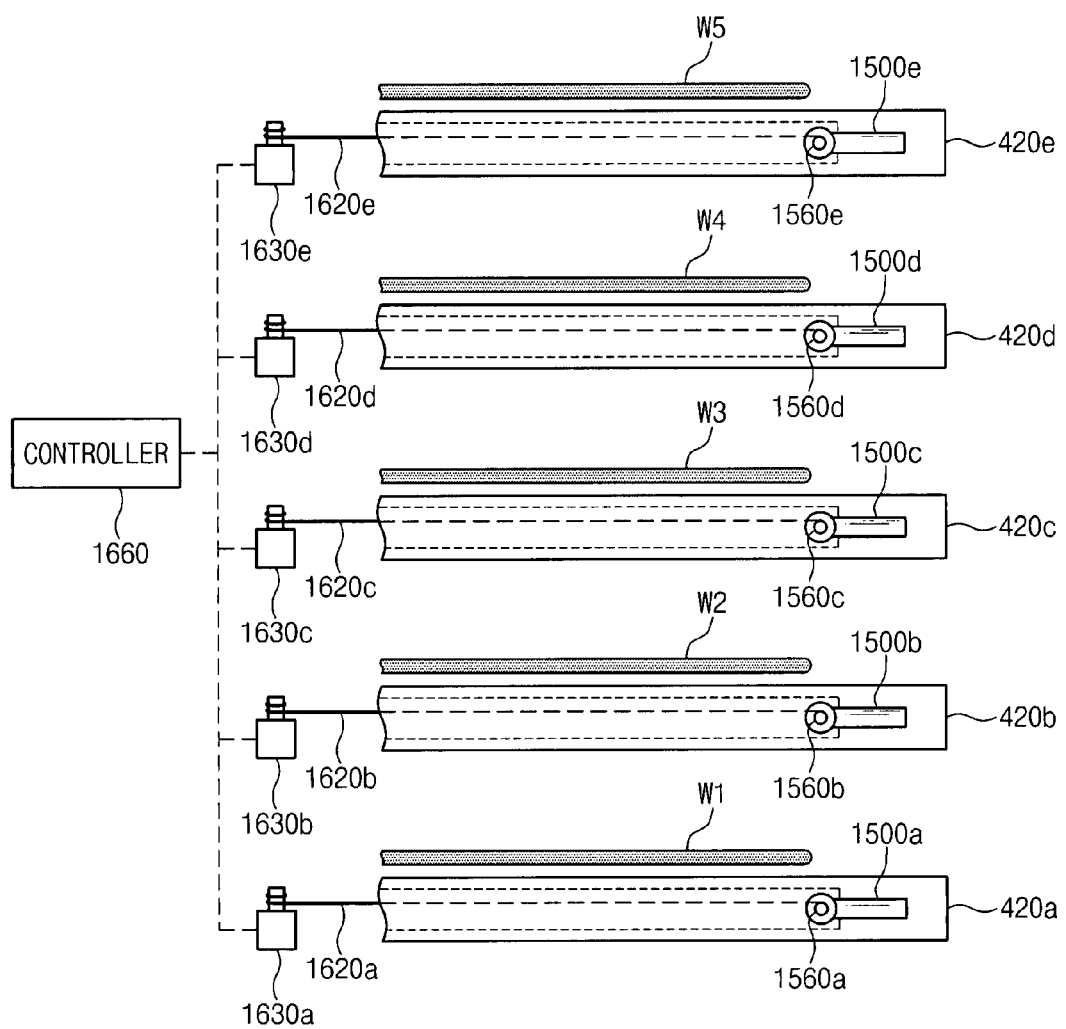
FIGS. 9*a* and 9*b* are diagrams showing the operation of the substrate transfer unit in FIG. 8.
Figure 9B:
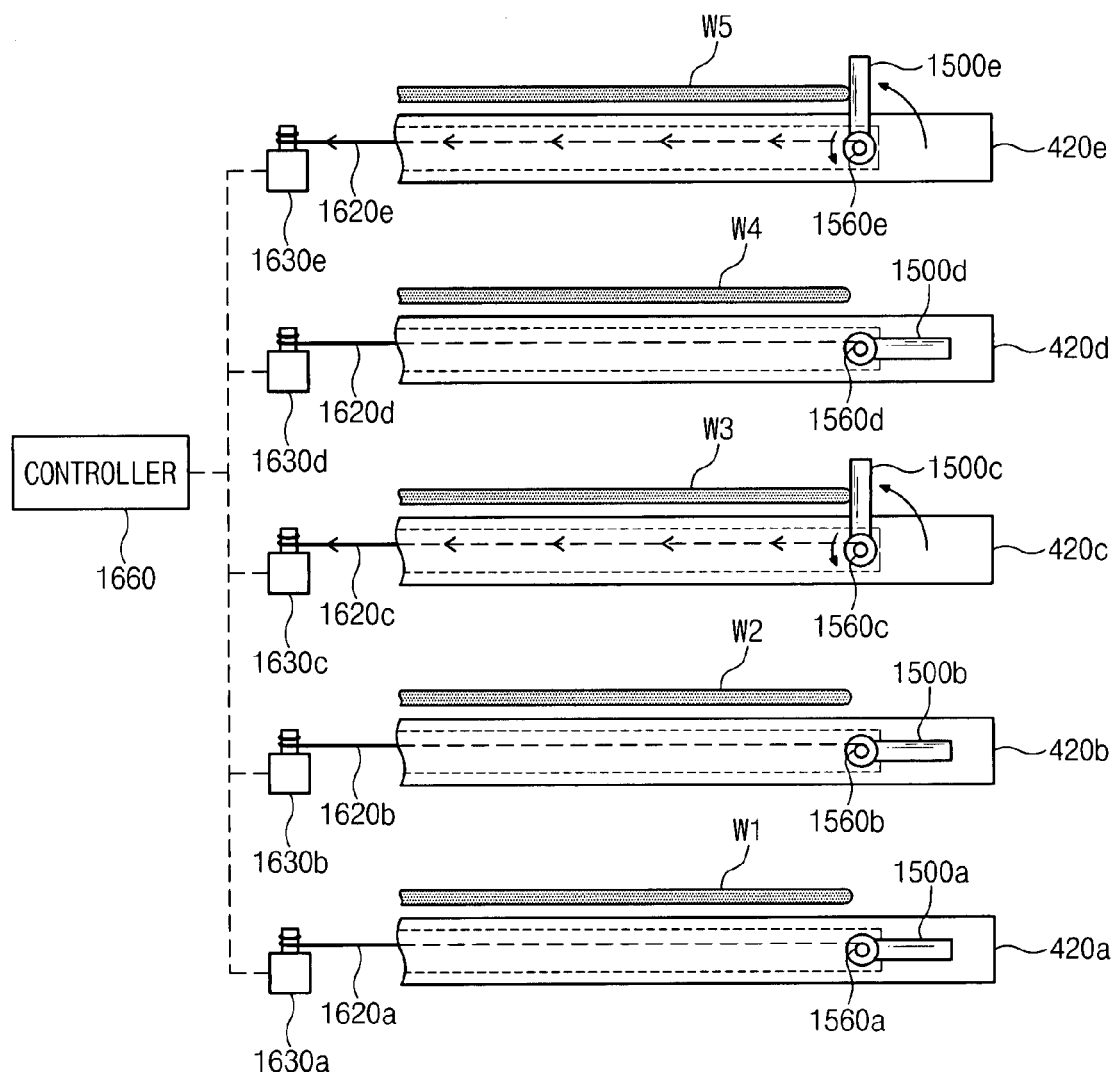

FIGS. 9a and 9b are diagrams showing the operation of the transfer unit 400 in FIG. 8.

Referring to FIG. 9a, first through fifth withdrawing members 1500a, 1500b, 1500c, 1500d, and 1500e are respectively provided on the first through fifth blades 420a, 420b, 420c, 420d, and 420e. One end of each of the first through fifth wires 1620a, 1620b, 1620c, 1620d, and 1620e is connected respectively to the first through fifth withdrawing members 1500a, 1500b, 1500c, 1500d, and 1500e, and the other end of each of the first through fifth wires 1620a, 1620b, 1620c, 1620d, and 1620e is connected respectively to first through fifth drivers 1630a, 1630b, 1630c, 1630d, and 1630e. The controller 1660 is used to control the first through fifth drivers 1630a, 1630b, 1630c, 1630d, and 1630e.

Also, first through fifth elastic members 1680a, 1680b, 1680c, 1680d, and 1680e are provided on first through fifth rotating shafts 1560a, 1560b, 1560c, 1560d, and 1560e. The first through fifth elastic members 1680a, 1680b, 1680c, 1680d, and 1680e provide elastic force in a clockwise direction. Accordingly, the first through fifth wires 1620a, 1620b, 1620c, 1620d, and 1620e are maintained in a wound state on the first through fifth rotating shafts 1560a, 1560b, 1560c, 1560d, and 1560e by means of the elastic force, so that the first through fifth withdrawing members 1500a, 1500b, 1500c, 1500d, and 1500e do not protrude to the outside from the first through fifth blades 420a, 420b, 420c, 420d, and 420e.

Below, FIGS. 9a and 9b will be referred to in describing a method of selectively transferring substrates.

First, the first through fifth blades 420a, 420b, 420c, 420d, and 420e are moved into the container 10 in operation S10. The first through fifth blades 420a, 420b, 420c, 420d, and 420e are respectively inserted in the lower portions of the slots formed in the container 10. Here, the first through fifth wafers W1, W2, W3, W4, and W5 are respectively supported within the slots, so that the first through fifth wafers W1, W2, W3, W4, and W5 are respectively disposed on top of the inserted first through fifth blades 420a, 420b, 420c, 420d, and 420e.

Next, withdrawing members disposed below wafers to be withdrawn from the first through fifth wafers W1, W2, W3, W4, and W5 are activated in operation S20. The operation of the first through fifth withdrawing members 1500a, 1500b, 1500c, 1500d, and 1500e is controlled by the controller 1660.

For example, when the third and fifth wafers W3 and W5 are to be withdrawn, the controller 1660 operates the third and fifth drivers 1630c and 1630e. When the third and fifth drivers 1630c and 1630e are operated, the third and fifth drivers 1630c and 1630e are rotated in a clockwise direction to wind the third and fifth wires 1620c and 1620e, as shown in FIG. 9b.

When the third and fifth wires 1620c and 1620e are wound, tension is transferred through the third and fifth wires 1620c and 1620e to the third and fifth rotating shafts 1560c and 1560e, so that the third and fifth wires 1620c and 1620e wound around the third and fifth rotating shafts 1560c and 1560e are unwound and the third and fifth rotating shafts 1560c and 1560e pivot in a counterclockwise direction. Accordingly, the third and fifth rotating bars 1520c and 1520e pivot in concert with the third and fifth rotating shafts 1560c and 1560e in a counterclockwise direction and protrude upward from the third and fifth blades 420c and 420e.

When the third and fifth rotating bars 1520c and 1520e protrude from the third and fifth blades 420c and 420e, the third and fifth blades 420c and 420e are withdrawn from the container 10 to withdraw the third and fifth wafers W3 and W5 from the container 10 in operation S30. Next, the withdrawn wafers are transferred to a predetermined location (the load lock chamber 220 within the processing equipment, for example) in operation S40.

As described above, a plurality of wafers loaded in a container can selectively be withdrawn and transferred to a load lock chamber 220 within processing equipment 200.

Figure 10A:
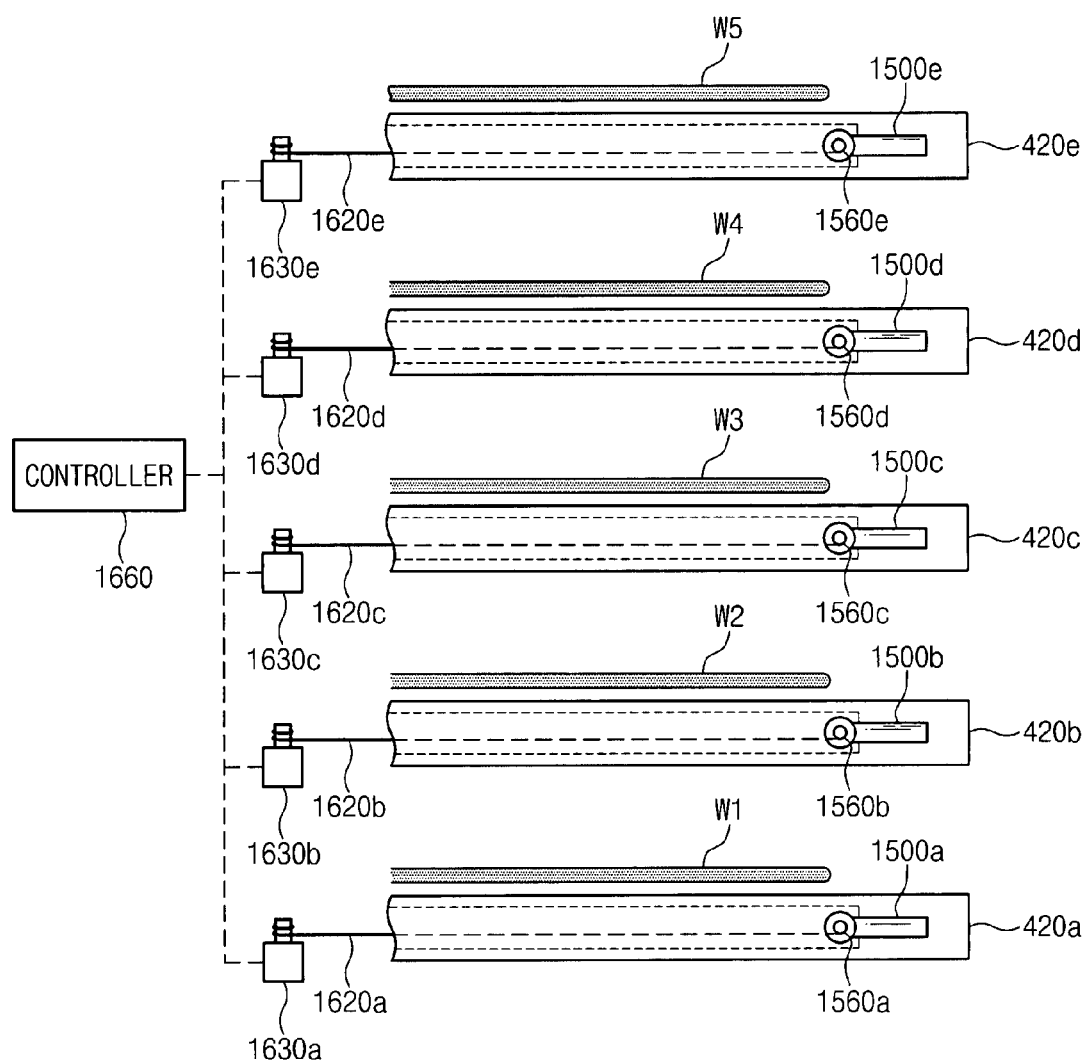
FIGS. 10*a* and 10*b* are diagrams showing the operation of a substrate transfer unit according to the third embodiment of the present invention.
Figure 10B:
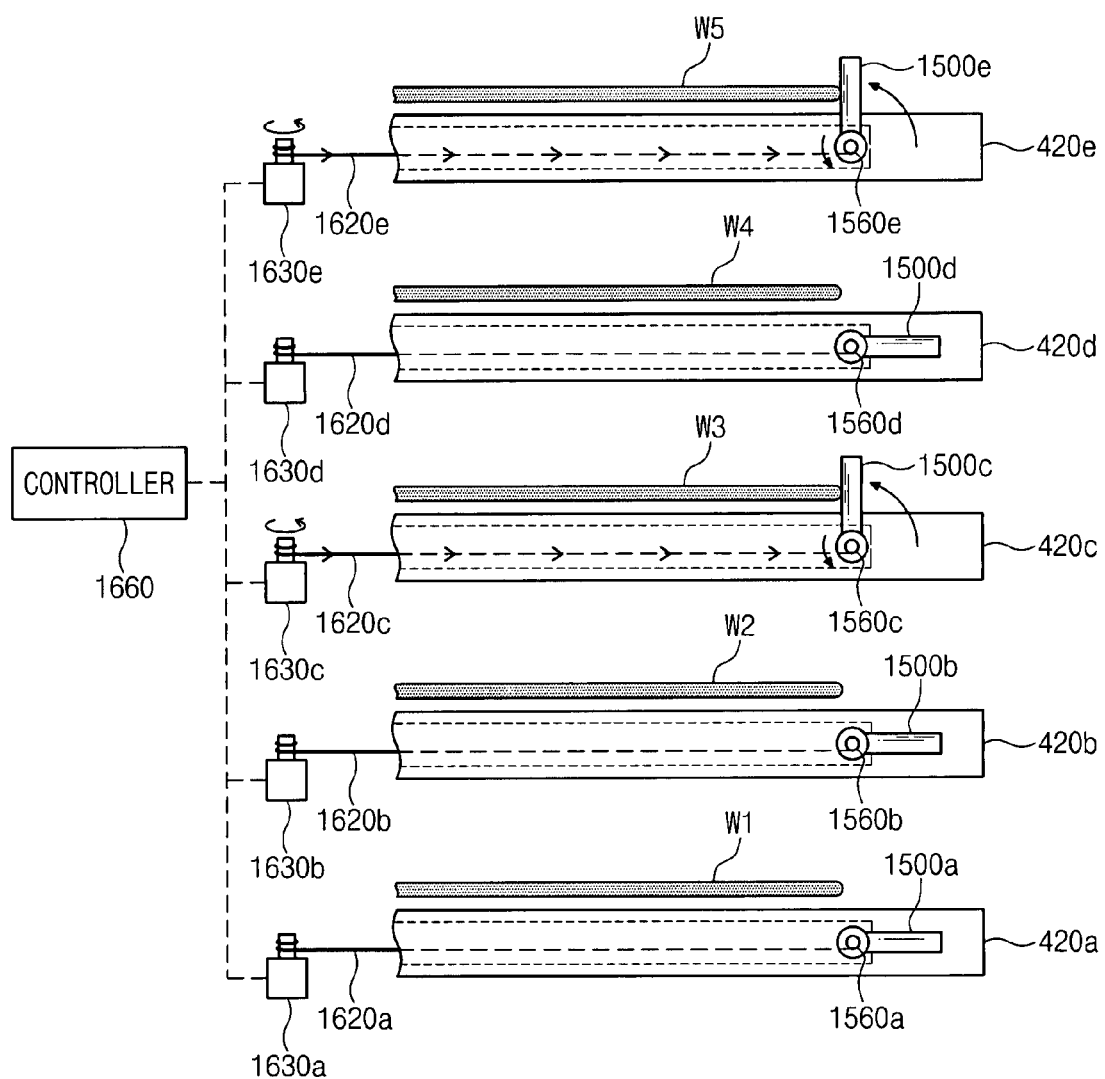

FIGS. 10a and 10b are diagrams showing the operation of a transfer unit 400 according to the third embodiment of the present invention.

The first through fifth elastic members 1680a, 1680b, 1680c, 1680d, and 1680e provided on the first through fifth rotating shafts 1560a, 1560b, 1560c, 1560d, and 1560e provide elastic force in a counterclockwise direction; and the first through fifth wires 1620a, 1620b, 1620c, 1620d, and 1620e are maintained in a taut state by the first through fifth drivers 1630a, 1630b, 1630c, 1630d, and 1630e. Thus, the first through fifth rotating shafts 1560a, 1560b, 1560c, 1560d, and 1560e are maintained in a state pivoted in a clockwise direction, so that the first through fifth withdrawing members 1500a, 1500b, 1500c, 1500d, and 1500e do not protrude out from the first through fifth blades 420a, 420b, 420c, 420d, and 420e.

If the third and fifth wafers W3 and W5 are to be withdrawn, the controller 1660 operates the third and fifth drivers 1630c and 1630e, as described above. When the third and fifth drivers 1630c and 1630e are operated, the third and fifth drivers 1630c and 1630e rotate in a counterclockwise direction to unwind the third and fifth wires 1620c and 1620e, as shown in FIG. 10b.

When the third and fifth wires 1620c and 1620e are unwound, the third and fifth elastic members 1680c and 1680e prompt the third and fifth rotating shafts 1560c and 1560e to pivot in a counterclockwise direction, so that the third and fifth wires 1620c and 1620e are unwound from around the third and fifth drivers 1630c and 1630e and are wound around the third and fifth rotating shafts 1560c and 1560e. Also, as the third and fifth rotating shafts 1560c and 1560e and the third and fifth rotating bars 1520c and 1520e pivot together in a counterclockwise direction, the third and fifth rotating bars 1520c and 1520e protrude upward from the third and fifth blades 420c and 420e.

Thus, a plurality of substrates loaded in a container may selectively be unloaded, according to the present invention.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for withdrawing a plurality of substrates from within a container and transferring the substrates, the apparatus comprising:
a plurality of blades on which the plurality of substrates are respectively placed during transferring;
a plurality of withdrawing members installed at respective ends of the respective blades to protrude upward from the blades when withdrawing the substrates from the container, wherein at least one withdrawing member of the plurality of withdrawing members comprises a rotating bar and a rotating shaft, one end of the at least one rotating bar being rotatably connected to at least one blade and the other end of the rotating bar being capable of rotating to protrude upward from the at least one blade, and the one end of the rotating bar perpendicularly connected to the rotating shaft, the rotating shaft rotating to cause the rotating bar to protrude from the at least one blade;
a driving unit for selectively protruding the withdrawing members from the blades thereby selectively withdrawing one or more of the plurality of substrates from within the container, the driving unit comprising a wire and a driver, one end of the wire being wound around the rotating shaft and the driver for rotating and winding the other end of the wire; and
an elastic member connected to the rotating shaft for providing elastic force to bias the rotating shaft such that the rotating bar is in a non-protrusive position with respect to the at least one blade.

2. An apparatus for withdrawing a plurality substrates from within a container and transferring the substrates, the apparatus comprising:
- a plurality of blades on which the plurality of substrates are respectively placed during transfer, the blades gradually widening to form at least one protruding end;
- at least one withdrawing member installed at the protruding end of respective blades configured to selectively withdraw and transfer one or more of the plurality of substrates;
- wherein the withdrawing member moves between a first position and a second position upon activation of a driver, when in the first position the withdrawing member extends in a linear direction parallel to a surface of the respective blades, and when in the second position the withdrawing member protrudes upwards perpendicular to the surface of the respective blades; and
- wherein an elastic member biases the withdrawing member in the first position, thereby causing the withdrawing member to extend in the linear direction parallel to the surface of the respective blades.

3. The apparatus according to claim 2, wherein the withdrawing member comprises a rotating bar perpendicular to a rotating shaft, the rotating shaft rotatably connected at a side of the protruding end.

4. The apparatus according to claim 3, wherein a wire is wound about the rotation shaft and connects the rotation shaft to the driver, the driver being located at an end opposite the protruding end.

5. The apparatus according to claim 4, the respective blades comprising a Y-shaped body and a slot, wherein the wire is guided along the slot from the driver to the rotation shaft by two rollers installed on an upper surface of the slot.

6. The apparatus according to claim 4, wherein the driver rotates to wind and unwind the wire about the rotation shaft thereby providing a rotation force causing respective withdrawing members to rotate between the first and second positions.

7. The apparatus according to claim 6, comprising first and second withdrawing members installed at the first and second protruding ends of the respective blades configured to selectively withdraw and transfer one or more of the plurality of substrates.

8. An apparatus for withdrawing a plurality substrates from within a container and transferring the substrates, the apparatus comprising:
- a plurality of blades on which the plurality of substrates are respectively placed during transfer, the blades comprising a slot and a Y-shaped body gradually widening to form at least one protruding end;
- at least one withdrawing member installed at the at least one protruding end of respective blades, the withdrawing member configured to selectively withdraw and transfer one or more of the plurality of substrates, wherein the withdrawing member comprises a rotating bar perpendicular to a rotating shaft, the rotating shaft rotatably connected at a side of the protruding end;
- wherein the withdrawing member moves between a first position and a second position upon activation of a driver disposed at an end opposite the protruding end, when in the first position the withdrawing member extends in a linear direction parallel to a surface of the respective blades, and when in the second position the withdrawing member protrudes upwards perpendicular to the surface of the respective blades; and
- wherein a wire is wound about the rotation shaft and connects the rotation shaft to the driver, and wherein the wire is guided along the slot from the driver to the rotation shaft by two rollers installed on an upper surface of the slot.

* * * * *